United States Patent [19]
Jacobs et al.

[11] Patent Number: 4,811,082
[45] Date of Patent: Mar. 7, 1989

[54] HIGH PERFORMANCE INTEGRATED CIRCUIT PACKAGING STRUCTURE

[75] Inventors: Scott L. Jacobs, Chester, Va.; Perwaiz Nihal, Hopewell Junction, N.Y.; Burhan Ozmat, Peekskill, N.Y.; Henri D. Schnurmann, Monsey, N.Y.

[73] Assignee: International Business Machines Corporation, Armonk, N.Y.

[21] Appl. No.: 929,946

[22] Filed: Nov. 12, 1986

[51] Int. Cl.⁴ .................. H01L 39/02; H01L 23/02; H01L 23/12
[52] U.S. Cl. .................................. 357/80; 357/74; 357/75; 174/68.5
[58] Field of Search .................. 357/80, 75, 74; 174/68.5

[56] References Cited
U.S. PATENT DOCUMENTS
4,667,220 5/1987 Lee et al. ...................... 357/80

OTHER PUBLICATIONS

"Packaging Technology for the NEC SX Supercomputer": IEEE Transactions on Components, Hybrids and Manufacturing Technology, vol. CHMT-8, No. 4, Dec. 1985, pp. 462–467, IEEE, NY, US; T. Watari et al.
"The Electrical Design Methodology for the Package Used in the IBM 3090 Computer", Wescon Proceedings, San Francisco, CA, Nov. 19–22, 1985, vol. 29, pp. 1–8 (7/3), NY, US; E. E. Davidson et al.
"IBM Multichip Multilayer Ceramic Modules for LSI Chips–Design for Performance and Density", IEEE Transactions on Components, Hybrids and Manufacturing Technology, vol. CHMT-3, No. 1, Mar. 1980, pp. 89–93, IEEE, NY, US; B. T. Clark et al.

*Primary Examiner*—Robert S. Macon
*Attorney, Agent, or Firm*—Steven J. Meyers; Aziz M. Ahsan

[57] ABSTRACT

A high speed, high performance integrated circuit packaging structure that may be used for emulating wafer scale integration structures. The preferred embodiment comprises an interposer having a base substrate having alternating insulation and conductive layers thereon, wherein a plurality of the conductive layers are wiring means which are adapted for maintaining an extremely low noise level in the package. The low noise level and low resistance and capacitance of the wiring means allows a plurality of discrete semiconductor segments to be mounted on and interconnected by the integrated circuit package with a significantly reduced number of drivers and receivers than required by Rent's Rule. Each integrated circuit structure of the present invention emulates a large chip or wafer scale integration structure in performance without having to yield the large chip or wafer, and without redundancy schemes. A plurality of these integrated circuit packaging structures are combined by decals to form a central processing unit of a computer or a portion thereof. In an alternate preferred embodiment, the base substrate of the interposer is made of silicon and any required drivers are formed therein, thus substantially eliminating the need for any drivers on each of the discrete semiconductor segments.

25 Claims, 4 Drawing Sheets

HIGH PERFORMANCE INTEGRATED CIRCUIT PACKAGING STRUCTURE

FIELD OF INVENTION

This invention relates to the field of integrated circuit packaging, and more specifically to packaging integrated circuit groups on substrates to emulate wafer scale integration structures.

CROSS REFERENCE TO RELATED APPLICATION

This application is related to co-pending application Ser. No. 864,228, entitled "Module for Packaging Semiconductor Integrated Circuit Chips on a Base Substrate", the disclosure of which is incorporated herein by reference.

BACKGROUND

It is a purpose of this invention to provide for a wafer scale integration type package for high speed, high input/output (I/O), high density processors, particularly bipolar applications.

Wafer scale integration has been a desired packaging alternative primarily because it has the capability for achieving extremely dense integrated circuit packaging and high circuit speeds. Most of the recent wafer scale integration packaging schemes have not been widely used in industry primarily because of serious yield problems, and costly and complicated redundancy schemes utilized to alleviate the yield problems. Among the reasons for redundancy schemes being counter-productive are that the redundancy required occupies too much area on the chip so that a chip must be made larger to contain the same number of circuits; undesirable delays are introduced into the circuitry for redundancy algorithms; voting circuitry is required and cost is high.

The advantages of wafer scale integration include high packaging density, reduced line capacitance, reduced power dissipation, increased circuit speeds, increased reliability, and reduced package and board costs. It is desirable to achieve these advantages in a high performance package without paying the penalties of low yields and the problems of redundancy. The following references represent attempts at achieving many of the advantages of wafer scale integration by not attempting a total wafer scale integration approach interconnecting a plurality of chips on a wafer.

Chong et al. of Trilogy Systems Corporation in an article "A High Density Multichip Memory Module"; published July 1, 1985 by Trilogy Systems Corporation describe an approach of using thin film interconnect technology to package a plurality of VLSI logic and memory chips on a single module as a means of achieving Wafer Scale Integration. The module is based on a thin film copper-polymer technology which displays advantages over multi-layer ceramic technology when comparing interconnect delays and interconnect densities. The module substrate is assembled in a conventional dual in line package upon which are mounted CMOS memory chips and chip capacitors for high frequency bypassing. The package lacks capability for high I/O density and is thus restricted to low performance applications. Thus, it would be inadequate for high speed, high I/O count, bipolar applications.

"The Significance of Wafer Scale Integration in Computer Design", in the IEEE Proceedings of International Conference Computer Design, October 1984 by R. R. Johnson, and U.S. Pat. No. 4,458,297 describe a hybrid interconnection packaging structure for packaging CMOS chips. The structure utilizes a wafer having two levels of silicon wiring separated with amorphous silicon, forming a wiring pattern that can be electrically programmed. Standard commercial chips are wire bonded to the wafer at cells formed by the wiring pattern. Among the limitations of the package are that once a thin film line is used, the remaining line segments that are not used for signal transmission become antenni, adversely affecting electrical performance in the package. There are no means for precise impedance control required for bipolar circuitry having multiple operating voltages. The fact that standard commercial chips, i.e. each chip having a group of internal circuits, drivers and receivers, are utilized in the Johnson package, highlights yet another area in which the state of the art is presently lacking. The drivers and receivers in most cases occupy a substantial portion of the area of each chip (i.e. up to approximately 25-50% or greater depending upon the device technology), and the drivers are a significant user of power (25% and over in many applications, for example, off-chip drivers in many VLSI applications require approximately 5-15 mw each, whereas internal circuits require approximately 0.25-0.75 mw each, while the number of internal circuits usually exceeds the number of off-chip drivers by at least a factor of 10 in most applications), contributing heavily to chip cooling requirements that are increasing as chip and module circuit density are increasing.

The impedance control, coupled noise, delta-I noise, DC drop and capacitive continuity/reflections of the currently available packages are insufficient to have chips interconnected without off-chip drivers and receivers because the noise level in those packages creates an environment wherein the amplification of an off-chip driver is required for a signal to be successfully transferred between two internal circuits, i.e. the noise levels create an environment conducive to false switching. Also, in high performance, high speed VLSI systems, the noise due to reflections is critical because in such high speed systems, the "ringing" effect caused by such reflections causes a delay that cannot be tolerated. Thus, this reflection noise must be substantially reduced. In conventional circuit packaging, utilizing chips, modules, boards, etc., the number of inputs/outputs required as a function of logic circuit density is dictated by Rent's Rule. Rent's Rule is an empirical formula utilized in the industry whenever the total logic circuitry of an integrated circuit containing element (i.e. board, module) is subdivided into smaller units (i.e. chips) within the larger element, and the smaller units are interconnected by wiring the inputs and outputs (I/O) of the smaller units together. Rent's Rule is used in the industry to determine the number of I/O required to fully utilize (or utilize a desired percentage of) the internal circuitry contained in the smaller units (chip, etc.). Rent's Rule is described in various publications such as *Hardware and Software Concepts in VLSI*, edited by G. Rabbat, 1983, pp. 110-111; "On a Pin Versus Block Relationship for Partitions of Logic Graphs", in IEEE Transactions on Computers, Dec. 1971 by Landman et al. and U.S. Pat. No. 4,398,208. The Rent's Rule equation may be simply stated as follows:

$$\text{I/O required} = K[C]^R, \qquad \text{(EQ. 1)}$$

wherein

- K = a constant directly associated with the probability of utilizing the circuitry of the smaller unit. The range of K is between approximately 1.0 and 4.0 for respective probabilities of utilization between 0.1 and 0.9. The value of K is derived from empirical data that is dependent on specific wiring rules used by a circuit packager.
- C = the number of logic circuits in the smaller unit.
- R = Rent's exponent. Rent's exponent is derived empirically, and depends upon such factors as design efficiency and experience. Typical values of Rent's Exponent are between approximately 0.57 and 0.61.

In currently available chips, wherein the inputs/outputs each operate in conjunction with off-chip drivers and receivers, the number of drivers and receivers required is dictated by Rent's Rule.

In view of the above, a package that could eliminate or greatly reduce the requirement for drivers and receivers on chips would; allow chip area to be utilized for increasing the number and proximity of internal circuits wherein the useful data processing is done, would increase process or speed because of closer proximity of circuits and elimination of driver delays, and also would decrease chip power requirements so that simpler chip cooling means may be utilized.

Such a package would also be capable of emulating a wafer scale integration structure because the elimination or minimization of drivers and receivers would make each group of internal circuits, (each group typically being embodied in a discrete separate semiconductor structure), functionally behave like a group of circuits integrated into a wafer scale integration structure.

Other wafer scale integration designs have been described by Bergendahl et al in "Thick Film Micro Transmission Line Interconnections for Wafer Scale Integration", published in the Proceedings of the 3rd International Symposium on VLSI Science and Technology, 1985. The Bergendahl et al reference describes signal propagation means associated with conventional thin film interconnections on a wafer scale integration level. Bergendahl et al shows how thin film metal lines in the state of the art are unacceptably slow, and describes how thick film lines of certain geometries can achieve superior electrical performance. In addition to not being capable of providing the high densities associated with thin film lines, the reference does not address how to achieve an acceptable power distribution scheme to supply power throughout the wafer scale integration structure. Neither does the reference address the problems that are caused by simultaneous switching noise, coupled noise and achieving the low noise levels required in a wafer scale integration package having substantially no drivers or receivers.

In view of the above, there is a need in the art for an integrated circuit packaging structure which can provide the high circuit density, high performance characteristics of a wafer scale integration structure without suffering from low yields or high redundancy requirements. A need also exists for eulating wafer scale integration performance for high performance bipolar applications, and to reduce circuit power, and consequently reduce cooling requirements. There is also a need in the art for providing an integrated circuit packaging structure that is impedance controlled and has a plurality of interconnected internal circuits, integrated into discrete semiconductor segments, the segments being mounted on an underlying substrate. There is a need for each of the discrete semiconductor segments to have substantially no drivers and receivers or a minimum number thereof (i.e. substantially less than that predicted by Rent's Rule) for signal transmission between each discrete semiconductor segment; (however, the standard number of drivers and receivers per Rent's Rule will still be required for communications between integrated circuits on different underlying substrates). There is also a need in this package to have low inductance, low resistance power distribution while providing large amounts of current to circuits from more than one power supply. The package must have low coupled noise, DC drop, Delta-I noise and matched impedance to lower the noise contributions caused by reflections.

There is also a need for the underlying substrate to substantially match the thermal coefficient of expansion of each discrete semiconductor segment lying thereon.

SUMMARY OF THE INVENTION

It is a major object of the present invention to provide an integrated circuit packaging structure which can provide the high circuit density, high speed characteristics of wafer scale integration while high manufacturing yields are possible without requiring redundancy schemes.

Another object is to reduce circuit power requirements, and thus reduce cooling requirements.

A further object is to have a plurality of internal circuits integrated into discrete semiconductor segments, wherein the discrete semiconductor segments have a minimal amount of drivers and receivers.

A further object is to have low electrical noise levels in the package.

A still further object is to match the thermal coefficient of expansion of the discrete semiconductor segments to that of the substrate that they are mounted on.

These and other objects of the invention are accomplished by the structure of the present invention.

Briefly, the preferred structure for emulating wafer scale integration comprises a structure which may be in the form of a module or an interposer. A substrate, preferably silicon or glass or ceramic, has alternating conductive and insulation layers thereon. Internal circuits (i.e. logic circuits) are integrated into discrete semiconductor segments, which have a minimum of drivers and receivers therein, i.e. much less than that required by Rent's Rule for standard chips. The discrete semiconductor segments are brickwalled and electrically connected to the uppermost conductive layer.

Many of the conductive layers are patterned wiring means which are adapted for maintaining a noise voltage level in the package that is substantially less than the lowest logic threshold voltage in the package. This quiet electrical environment makes it possible to have a number of drivers and receivers much less than required by Rent's Rule. The wiring means comprise features such as: substantially coplanar power and signal lines wherein the signal lines are separated from each other by at least one power line, and three dimensional power planes which contribute to very low inductance power distribution. An area array of power and signal vias through the substrate also contributes to high performance by providing enhanced power distribution. In the low noise atmosphere of the present package, drivers are required only for off-interposer communication or for occasional long runs on the interposers or modules. Note that the term module is more appropriate when the wafer scale integration emulation structure described herein is self-contained on one capped substrate; and that the term interposer is more appropriate when a plurality of discrete semiconductor segments are combined to functionally emulate a very large chip or wafer, and a plurality of the interposers are combined on a larger substrate to form a larger capped module.

An alternative embodiment for the wafer scale integration module or interposer is wherein the substrate is made of silicon and any drivers required for off-interposer communication or occasional long runs are formed in the substrate itself. Thus, no drivers at all would be required in the discrete semiconductor segments. The minimization of drivers and receivers contributes to increased machine speed because driver delays are minimized, and density is increased. Reduction of drivers and receivers also reduces device cooling requirements and increases the area that may be allotted for internal circuits where the bulk of productive data processing is done.

A central processor for a VLSI computer system may be built by combining a plurality of interposers on an underlying module. Connections between the interposers are typically made by decals.

DESCRIPTION OF THE PREFERRED EMBODIMENTS

The preferred embodiments of the present invention are described with reference to the Figures.

The Structure

Figure 1:
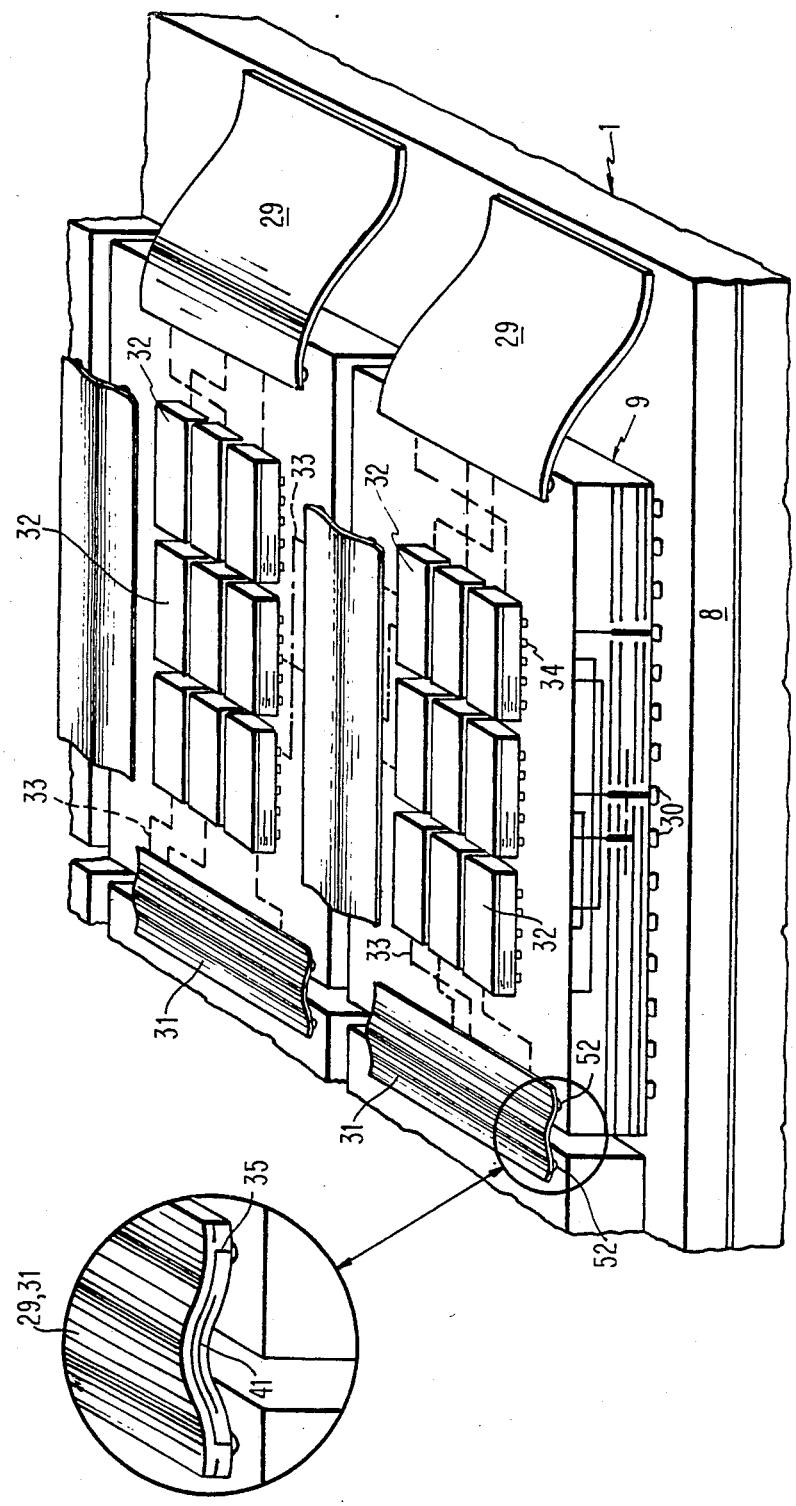
FIG. 1 represents an assembly of interconnected packaging structures in accordance with the present invention.

Referring to FIG. 1 a central processor 1 of a computer system is built by combining a plurality of integrated circuit carrying structures 9. The details of each structure 9 are shown in cross section in FIG. 2, described herein.

Figure 2:
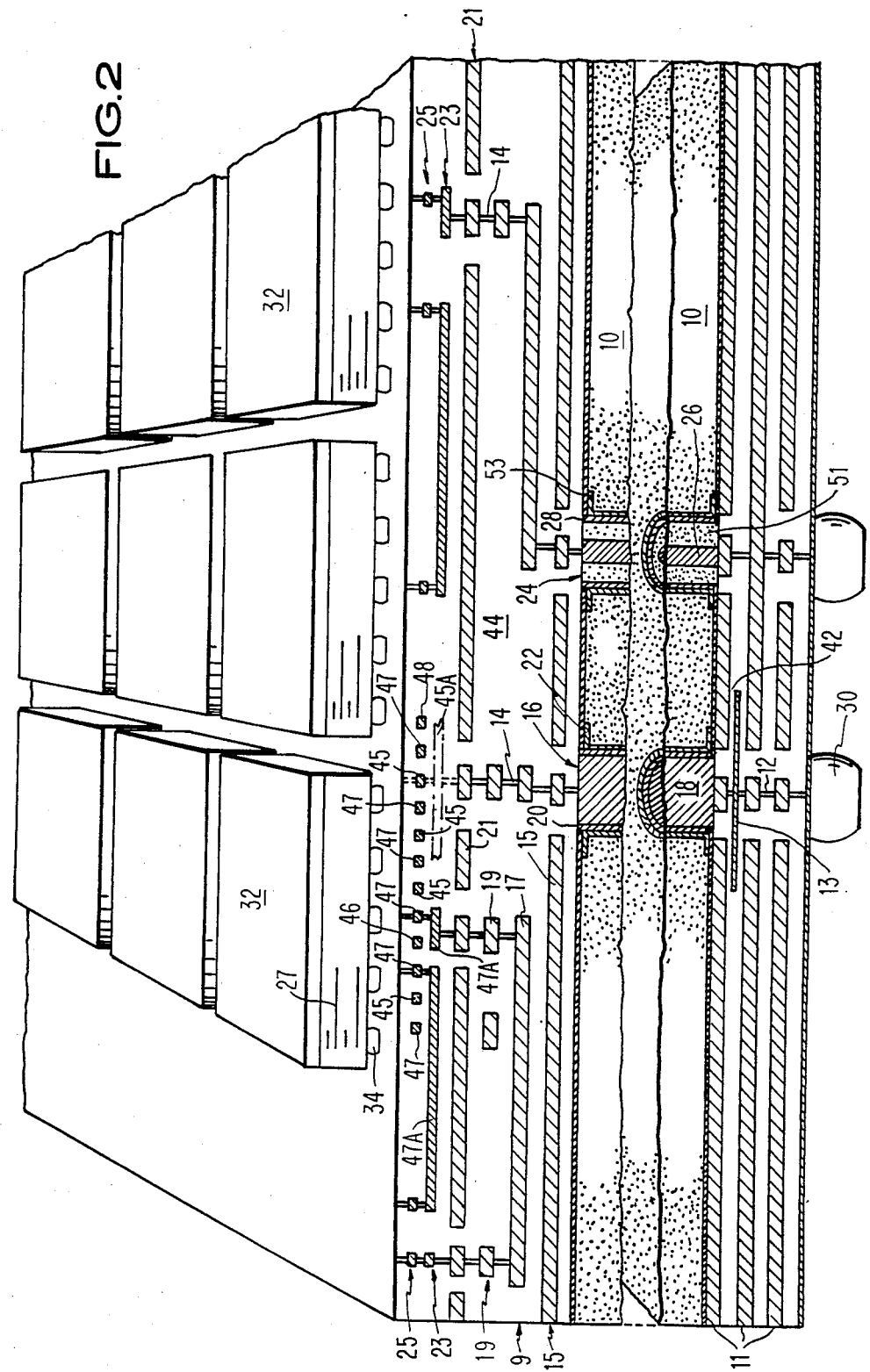
FIG. 2 represents a detailed front elevation view of the preferred embodiment of the circuit packaging structure of the present invention.

Referring to FIG. 2, the preferred form of each integrated circuit packaging structure 9 is an interposer (i.e. an interposer being a structure that is placed between two other structures, for example, between a chip and a multilayered ceramic module). The remaining discussion will refer to the integrated circuit packaging structures 9 as interposers, but it should be understood that these teachings also apply if integrated circuit packaging structures 9 are self-contained modules or the like. The interposer base 10 is typically made of a material having a polished upper surface, such as ceramic, glass, glass ceramic, low expansion metals such as molybdenum, tungsten or CuInCu, or semiconductors, preferably silicon, for thermal expansion matching reasons that will be described hereinafter. Mounted on top of both base 10 and interconnection wiring and insulation layers are a plurality of discrete semiconductor segments 32 (i.e. high performance bipolar circuits, I²L, ECL, etc.), each discrete semiconductor segment 32 comprising a plurality of internal integrated circuits. In preferred form, there are a minimum of drivers and receivers in each of the semiconductor segments, but the overwhelming majority of the circuits embodied in semiconductor segment 32 are internal circuits. There are a minimum of drivers and receivers for off-interposer communication and occasional long wiring runs on the interposers. Nevertheless, using the present invention, the numbers of drivers and receivers required for each semiconductor segment 32 is much less than required for a standard chip, which is made of internal circuits, drivers and receivers wherein the driver and receiver requirements for a given number of internal circuits and circuit utilization is governed by Rent's Rule. For example, assuming a standard interposer or module having 9 smaller units, (i.e., a 3×3 array of standard chips), each smaller unit (i.e. chip) having 12,000 circuits, the total I/O required for a standard chip, assuming a 50% chance of full circuit utilization (wherein K=2.4); and Rent's exponent=0.57;

then, I/O required per chip by Rent's Rule is equal to $$2.4\,(12{,}000)^{0.57} = 507 \text{ I/O per chip.}$$

Since there are 9 chips, 4567 I/O would be required for the standard module or interposer. For standard chips, substantially all outputs require drivers and substantially all inputs require receivers; thus approximately 4567 drivers and receivers would be required for the 9 chips.

However, when the 9 smaller units are packaged into a wafer scale integration type structure wherein the 9×12,000 circuit smaller units (i.e. discrete semiconductor segments 32 in the present invention), are interconnected to form a larger 108,000 circuit functional entity; and wherein wiring in the interposer or module structure substantially electrically resembles the wiring on the smaller units, and the noise level in the package is low enough so that no driver amplification is required for communication between circuits on the interposer, then the total structure I/O would be:

$$2.4\,(108{,}000)^{0.57} = 1775 \text{ I/O per interposer or module structure.}$$

Thus, using such a structure, only 1775 drivers and receivers are required for the 9 chips. Thus, the difference between the number of drivers and receivers required in a standard package containing 9 standard 12,000 circuit chips and an interposer or module emulating a wafer scale integration structure containing 9×12,000 circuit semiconductor segments 32 is as follows:

Ratio of drivers/receivers required for standard chips in standard package to drivers/receivers required in wafer scale integration emulation package = $\frac{4567}{1775}$ = 2.5 in the example above Thus, the general expression for the factor demonstrating the overall reduction in drivers and receivers required in a package may be expressed as :

$$\frac{\text{The sum of the drivers/receivers required in a standard package}}{\text{the number of drivers/receivers required for a wafer scale integration emulation package}} = \frac{K \Sigma (C_m)^R}{K [\Sigma C_m]^R} = \frac{\Sigma (C_m)^R}{(\Sigma C_m)^R} \quad \text{(EQ. 2)}$$

wherein $C_m$ is equal to the number of logic circuits on each of m chips on a packaging structure.

To find the reduction of drivers/receivers for each small unit, divide the number of drivers and receivers normally required by Rent's Rule for a standard chip (S) by the factor calculated by EQ. 2; i.e.

$$S \div \frac{\sum_1^n (C_m)^R}{\left(\sum_1^n C_m\right)^R}$$

In sum, from the above example, for a standard 12,000 circuit chip, there are 507 drivers/receivers required when a 50% wiring probability is desired, and Rent's exponent=0.57.

When the wafer scale integration emulation package of the present invention is used, then the number of drivers/receivers required on a weighted average basis is 507/2.5=202 drivers/receivers per small unit.

Most of these approximately 202 drivers/receivers on each small unit are for off-interposer signal communications.

As an alternative example, instead of having a group of 9 identical chips or semiconductor segments 32, each having 12,000 logic circuits to equal a total of 108,000 circuits, each structure 9 has 9 chips or semiconductor segments having varying circuit counts, i.e.

2 at 9,000 circuits each
2 at 18,000 circuits each
2 at 15,000 circuits each
2 at 6,000 circuits each
1 at 12,000 circuits each.

Assuming a Rent's exponent=0.57, the total number of drivers and receivers required per Rent's Rule (i.e., see EQ. 1 on page 4) for 9 standard chips would be approximately 4483. Applying EQ. 2 above, the drivers/receivers for all 9 semiconductor segments in the present invention is reduced by a factor of approximately 2.5. The reduction in the number of drivers and receivers is possible by interconnecting semiconductor segments 32 on a structure having an electrical environment wherein interconnections between the segments 32 resemble interconnections on a single segment, and the total noise level in the package (i.e. coupled noise, Delta-I noise, reflections, DC drop and random noise) is at an extremely low level so that there is no false switching of the circuits in the package.

An extremely quiet electrical environment, which exists in the present wafer scale integration emulation package, is an absolute requirement for such reductions in the amounts of drivers/receivers. The structure shown in FIG. 2 and described below provides such an environment wherein each interposer 9 can electrically emulate a large wafer scale integration chip or wafer, and have the corresponding reduced number of drivers and receivers on each semiconductor segment 32. The structure has a high logic threshold voltage to noise ratio because of the extremely quiet environment in the package. The structure also has low capacitance and resistance so that no driver amplification is required in most cases, even when considering the lowest logic threshold voltage level in the package.

Referring to FIG. 2, the discrete semiconductor segments 32 must be placed in close enough proximity to each other so that the performance of a monolithic integrated circuit structure is achieved. Preferably, the semiconductor segments are substantially brick-walled, (i.e., typically within sub-millimeters of each other, spacing usually being an order of magnitude less than the semiconductor segment size), and mounted to the top of the interposer 9 with small (preferably approximately 1-3 mils) solder balls 34. The discrete semiconductor segments 32 in this embodiment comprise mostly internal circuitry and a minimum number of drivers and receivers. Most drivers and receivers on the discrete semiconductor segments 32 are for either occasional long wiring runs required on the interposer 9 or for off-interposer signal communication. On the discrete semiconductor segments 32 is very fine wiring 27, preferably in the 1-2 micron range for the local wiring within the semiconductor segments 32. The discrete semiconductor segments 32 are wired together via solder balls 34 and the thin film wiring layers 17, 19, 23, 25. These wiring layers may be of any conductive material, preferably copper. The insulation 44 between and around the conductive lines is preferably material of a low dielectric constant, most preferably polyimide. The solder balls must be small so that the impedance between the internal circuits on the semiconductor segments 32 and the wiring of interposer 9 is substantially constant, allowing the internal circuit groups to communicate on the interposer with substantially no drivers and receivers. In preferred form, solder balls 34 are 1-3 mils in diameter. In this size range, the solder joints electrically resemble a thin film stud or metal filled via, thus contributing to making the wiring path between semiconductor segments 32 appear electrically continuous. Most of the internal circuits from the semiconductor segments 32 are wired together by wiring layers 23 and 25 whose wires preferably run in the X and Y directions respectively. Below wiring levels 23 and 25 is a reference plane 21 which serves as a reference for the wires 23, 25 above the reference plane, and wires 17, 19 below it, and also shields the X and Y wiring 23, 25 in the upper wiring levels from the X and Y wiring 17, 19 below it. Below the reference plane 21 are longdistance connection wiring layers 17 and 19, preferably running in the X and Y directions respectively. The long distance wiring gives a higher conductivity wiring path for running signals to the periphery of the interposers 9 and for off-interposer communication. Below wiring layer 17 is a lower reference plane 15. The vertical interconnects 14 between the aforementioned wiring layers are typically made by conventional thin film via technology. In order for this package to perform without drivers and receivers for most of the "on-interposer" signal transmission, it is required that the logic threshold voltage level for the devices be much higher than the total noise level in the package. The critical factors to consider are coupled noise, line resistance (i.e. DC drop), delta-I noise and reflection contributions. A preferred wiring structure that provides very low noise levels is described as follows. In addition to contributing to the electrical environment required to operate without the majority of drivers and receivers, these wiring structures are readily manufacturable, and result in high yields.

Figure 4:
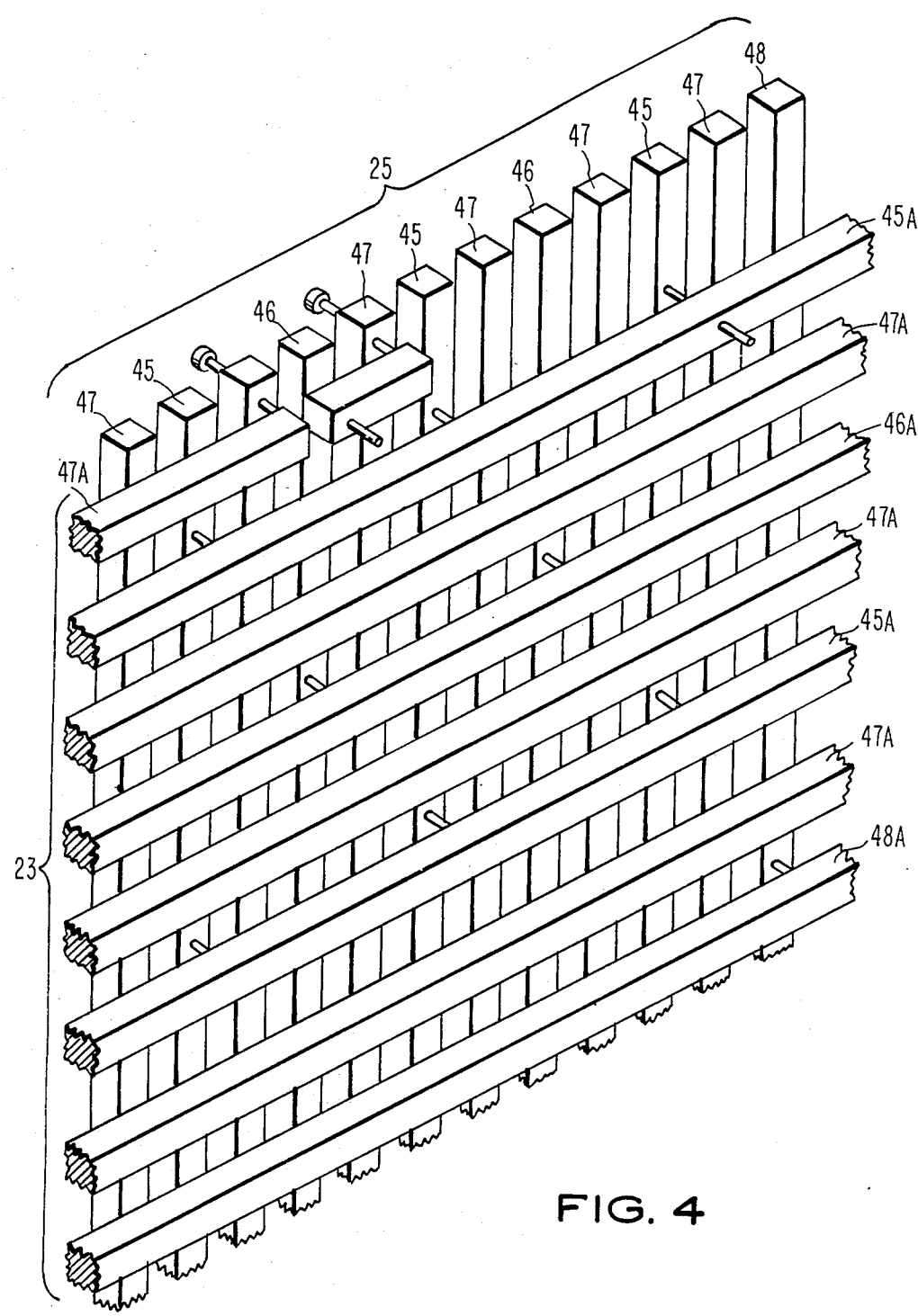
FIG. 4 represents an enlarged partial view of the portion of the wiring means shown in FIGS. 2 and 3.

Note that the specific dimensions of the preferred thin film wiring are a function of the size of the interposer 9, the conductor material and the specific application and density desired. For an interposer having dimensions between approximately 1 inch square and 5 inches square, supporting high performance bipolar circuitry, and having copper wiring and very high density (i.e. 5 micron lines on a 10 micron pitch) the following dimensions would preferably apply. The X-Y wiring layers 25, 23 would typically be in the order of approximately 3–10 microns wide, preferably approximately 5 microns wide, and approximately 3–10 microns high, preferably 4–5 microns. Referring to FIG. 4, in order for signals travelling throughout the lines on layers 25, 23 to not require drivers for amplification, the wiring on each layer should preferably comprise alternative signal lines 47, 47a respectively and power lines 45, 45a, 46, 46a, 48, 48a, respectively, wherein substantially no two signal lines 47, 47a on the same plane are adjacent to each other without a power line 45, 45a, 46, 46a, 48, 48a being interspersed in between. Thus, in layers 25, 23, each line 47, 47a represents a signal line and each of lines 45, 45a, 46, 46a, 48, 48a represents a power line, typically of a different voltage level. Note that each of lines 45a, 46a, 47a, 48a are on X-wiring layer 23, while lines 45, 46, 47, 48 are on Y-wiring layer 25. These lines may be at any voltage level desired and may also all be at the same voltage level, however in the preferred embodiment the package is for high performance bipolar devices having three different operating voltages. In addition to alternating signal lines and power lines on each layer 25, 23, three-dimensional power planes contribute to the quiet electrical environment. The three dimensional power planes comprise a plurality of interconnected X and Y power lines from layers 23 and 25 which is best shown in FIG. 4. Substantially all of the power lines of the same voltage level (i.e. voltage level 1) on the X direction wiring level 23 are interconnected with substantially all of the power lines of the same voltage level (i.e. also voltage level 1) on the Y wiring level 25. The power lines of other voltage levels are also interconnected in similar fashion. Power lines 45, 45a, 46, 46a, 48, 48a on wiring layers 25 and 23 represent power lines at three voltage levels, voltage 1, voltage 2 and voltage 3, respectively. Thus, substantially all power lines 45a of X wiring layer 23 are interconnected with substantially all power lines 45 of Y wiring layer 25; and substantially all power lines 46 of layer 23 are interconnected with substantially all power lines 46 of layer 25; etc. The three dimensional power planes are fully described in co-pending application Ser. No. 864,228 to the same assignee, which is hereby incorporated by reference. Combined with alternating signal and power lines, the three dimensional power planes provide for virtually no coupled noise and extremely low noise overall, and low resistance power distribution, so that there may be no drivers and receivers between the majority of semiconductor segments 32 on each interposer 9.

The structure achieves wafer scale integration performance in high performance applications, typically bipolar or combination bipolar/CMOS applications requiring multiple operating voltage levels for the internal circuits. To achieve high performance and the advantages alluded to above in the present package, a peripheral arrangement of power distribution is not acceptable. The primary reason that it is unacceptable is that high levels of integration of high speed circuits cannot be accomplished if power must be distributed from the periphery of a relatively large packaging structure. Thus, most of the power delivered to the devices on the semiconductor segments 32 is delivered in the form of an area array of power vias, preferably located beneath each of the semiconductor segments 32. They provide for a shortened inductive path, and in combination with the wiring means of the present invention enhance power distribution so that noise and power requirements are reduced. In preferred form, a plurality of both signal feedthroughs 24 and power feedthroughs 16 are provided in substrate 10. In a preferred embodiment, where substrate 10 is comprised of silicon, the array of either substantially all power feedthroughs 16, or an array of both power feedthroughs 16 and signal feedthroughs 24 are formed in accordance with the following paragraphs which describe the remaining elements of the present packaging structure.

In addition to an array of power feedthroughs 16 or the preferred power 16 and signal 24 feedthroughs in combination, the close proximity of semiconductor segments 32 to each other is required. For high performance applications, it is preferred that semiconductor segments 32 be substantially brickwalled (i.e., spacing being approximately in the range of an order of magnitude less than the semiconductor segment size). This increases density and speed, as well as enhancing driverless communication between internal circuits on different semiconductor segments 32.

Many high performance applications also require signal communication between circuits on semiconductor segments at the extremities of each interposer or module 9. In some cases drivers may be required. However, the number is much less than required by Rent's Rule. Despite the low noise wiring means, substantially brickwalled semiconductor segments 32, and feedthroughs 16, 24; alternate wiring to the wiring of layers 23 and 25 is required for long distance communication between circuits on the extremities of the interposers or modules 9. The longdistance connection wiring 17 and 19 is typically an X-Y wiring pair. These lines, assuming copper conductors and the dimensions described above, would preferably be on the order of approximately 10–20 microns wide and approximately 10–20 microns tall. This would give the conductivity required to travel distances required for going off of the interposers 9 to either adjacent interposers or a substrate 10 that the interposers are mounted on, or for occasional long on-interposer runs.

As stated above, the substrate 10 is preferably silicon. The primary reason for substrate 10 being silicon is that the small solder balls on the semiconductor segments 32 are very sensitive to stress and are subject to failure due to thermal coefficient of expansion mismatches between the semiconductor segments 32 and the substrate 10. The smaller the solder ball, the more likely that thermally induced stress will result in a connection failure. Since the majority of semiconductor segments 32 are made of silicon, if the substrate 10 is matched to the silicon segments 32, the small solder balls will present less of a problem during thermal transients of the affected semiconductor segments during heating up and cooling down periods. At the bottom of the interposer 9 there are preferably large solder balls 30 which are preferably in the range of 5–15 mils.

Power and signal feed throughs 16 and 24 respectively, are formed through the base and filled with metal. Note that in embodiments where a semiconductor material is not used as the base substrate 10, but the substrate is made of a dielectric material, ceramic for example, that the vias may be simple metal filled vias. However, for the preferred embodiment, wherein a semiconductor such as silicon is used, the power and signal feed-throughs 16, 24 described hereinafter are required because signals would normally attenuate when traveling through a metal via in a semiconductor body. For power vias 16, little isolation from the semiconductor, i.e. silicon is necessary, thus little dielectric between the metal and the silicon is required. In fact, from a performance standpoint it may be desirable to have less isolation in the case where semiconductor base 10 is heavily doped because the power feed-throughs and semiconductor body 10 (if heavily doped) combined, would act as a power supply decoupling capacitor. Thus, metal 18 is deposited through the hole by conventional means (i.e. plating, chemical vapor deposition (CVD), selective tungsten CVD, etc.), and layer 20 surrounding the metal would be a thin dielectric such as a nitride or an oxide. Layer 22 which surrounds dielectric layer 20 would preferably be a junction isolation diffusion for preventing any of the power vias 16 from shorting together. A junction isolation is accomplished by conventional means, for example if we had an N-type bulk silicon substrate 10, then layer 22 would be a P diffusion in a hole, and the N-type bulk silicon substrate would be powered at the most positive voltage level in the package. With respect to signal feed-through 24, there is basically similar junction isolation 53 and a thin oxide or nitride dielectric layer 28 as described for the power via; but in addition, in order not to lose the signal, there is a thick, low expansion dielectric 51, i.e. low expansion polyimide, surrounding the metal 26. Since via 24 is a signal via, the current going through is relatively small, and the diameter of metal 26 may be less than metal 18, i.e. preferred diameter of metal 18 is approximately 4-10 mils, while preferred diameter of metal 26 is approximately 2-5 mils. Metal 18, 26 is preferably low expansion metal such as tungsten or invar.

Below silicon base 10, power planes 11 are illustrated. Functionally, these planes can be either above or below the substrate 10; however it is more efficient from a structural point of view for these planes to be below the base substrate because the base substrate is less likely to warp or buckle. These power planes are the local power planes for the integrated circuits on semiconductor segments 32. The voltage level of the power planes can be any of the typical voltages used in bipolar applications. In close proximity to the semiconductor segments 32 are preferably a plurality of thin metal capacitors 13. These are planar thin film capacitors integral with the package which decouple the power supply at individual vias 18 to any of the power planes in the package. Each capacitor is preferably comprised of one layer of metal, and each of the capacitors is built with conventional thin film techniques such as liftoff. An example of a suitable thin film capacitor is described in U.S. Pat. No. 4,471,405. The placement of the capacitors is very close to the integrated circuits and contributes to the wafer scale integration capabilities of this package because there is a short inductive length between switching drivers and power supply decoupling capacitors. The dielectric 42 between the thin film capacitors and any of the power planes would be a relatively high dielectric material, therefore resulting in high capacitance between power supplies. An example of the dielectric material 42 would be nitrides having a dielectric constant between the approximately 10 and 20. Metal filled vias 12 are the thin filled vias passing through the power planes 11. Large solder balls 30 join the interposers to a support substrate 8 (see FIG. 1). The support substrate 8 may be any suitable material that may be solder joined, but preferably the substrate is made of ceramic material or is a packaging type substrate such as a multilayer ceramic substrate.

This preferred structure allows the cluster of semiconductor segments 32 to behave like a very large group of integrated circuits, much larger than any VLSI devices existing today. Depending on the number of segments 32 and the circuit density of each segment, a dense wafer scale integration structure having high speed signal transmission may be emulated primarily because there would be no delay that is normally associated with the driver and receiver switching on a conventional module or interposer, and there is very little difference between a fast internal circuit communicating on a semiconductor segment 32 and a fast internal circuit communicating to another semiconductor segment 32 on the same interposer 9. The semiconductor segments 32, interconnected as described above, would substantially provide the performance of a wafer scale integration structure. Such performance and operation will be described in the following operation section of the preferred embodiments.

Figure 3:
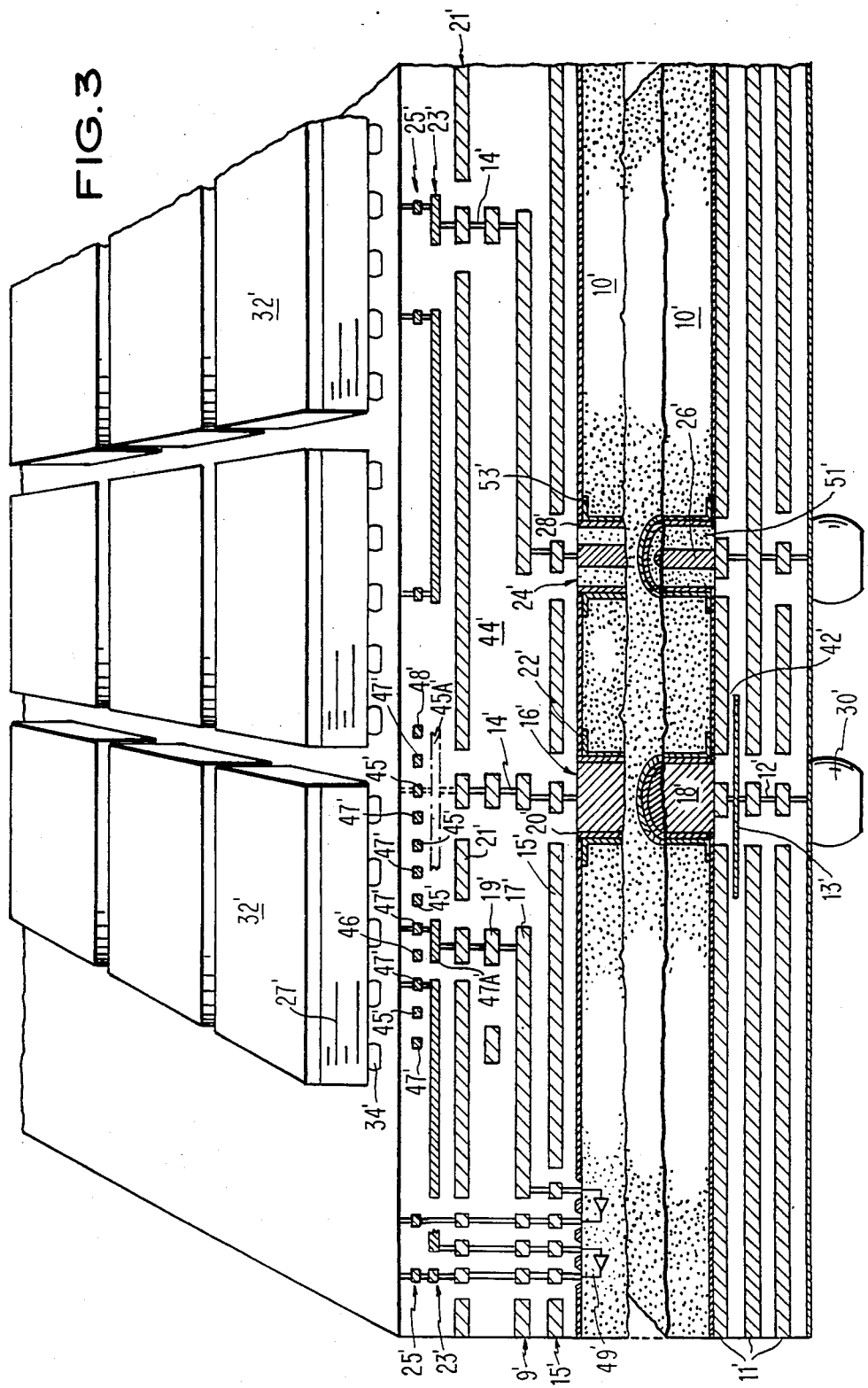
FIG. 3 represents a detailed front elevation view of an embodiment of the circuit packaging structure of the, present invention wherein drivers are formed in the silicon base substrate.

An alternative embodiment for the interposer is shown in FIG. 3. In this embodiment substantially zero off-interposer drivers are located on the semiconductor segments 32' themselves, but instead the off-interposer drivers 49' are located on the periphery of the silicon substrate 10', built into the silicon substrate itself. Any drivers required for either off-interposer communication or occasional long on-interposer wiring runs that the interposer wiring could not handle without drivers and receivers, are formed in semiconductor base 10' by standard semiconductor processing means, such as conventional photolithography, etching, doping, metallization and dielectric deposition. In this embodiment, long distance connection wiring 17' and 19' would no longer be required to be as highly conductive as in the first embodiment because the drivers are located closer to the off-interposer transfer media, (i.e. decals shown in FIG. 1 and described hereinafter), and the distance to travel after the driver 49' is substantially less, thus the lines that were in the 10 to 15 micron thickness range can be considerably thinner i.e. preferably in the 3-10 micron range. When the off-interposer drivers 49' are in the silicon 10'; long distance connection wiring 17', 19' run in the X and Y directions respectively and then down into the silicon 10', and then leave the interposer through by being driven from the drivers 49' in the silicon, through wiring layers i.e. 23', 25', 17', 19' to the peripheral portions of wiring layers 25', 23', (i.e. see lines 33 in FIG. 1 which represent the peripheral portions of wiring layers 25', 23') to decals 29, 31. Preferably, the decals 29, 31 are connected to wiring portions 33 by solder balls 52. Note that wiring 33 in FIG. 1 represents the top view of portions of either lines 17, 19, 23, 25 or 17', 19', 23', 25' where they leave the area underneath the semiconductor segments 32, and run to decals 29, 31. As shown in FIG. 1, there are many different routes this wiring may take. The organization of wiring 33 is such that the wiring that carries a signal input to a decal 31 runs in the same direction as that wiring carrying the same signal off of the decal. This organization allows decals 31, 29 to only require one level of signal wiring 35 because no crossing of signals on the decals is required.

Referring to FIG. 1, a plurality of interposers 9 are mounted onto substrate 8. Substrate 8 is preferably a multilayer ceramic substrate wherein the wafer scale integration equivalent interposers (i.e. each interposer emulating a wafer scale integration large scale or large chip or wafer), are clustered together. The majority of the signal wiring between the interposers 9 is through thin film lines 35 in decal 29, 31 interconnections. The decals 29, 31 are made of a low dielectric flexible material (i.e. preferably polyimide) contributing to high transmission line speed. Thin film wiring is typically embedded in the dielectric, the wiring basically comprises signal wiring 35 and ground lines 41 for shielding. Pluralities of the interposers 9 are joined to the underlying substrate 8 by solder balls 30. Interposer to interposer connections, between neighboring interposers or second nearest neighboring interposers would be carried out through the decals 31 wherein the signal lines are fanned out from the semiconductor segments 32, (see FIGS. 2 and 3) to the decals through solder balls 30, wiring 23, 25, and 17, 19 where applicable, and solder balls 52 into the thin film metal signal wiring 35 of the decal, then the signal is transferred to the next interposer. Thus, the majority of signals transmitted from one semiconductor segment 32 on one interposer 9 to another semiconductor segment 32 on another interposer 9 is carried in thin film of a high conductive nature through the decals. Wiring lines 33 on the interposers preferably organize the signals leaving the interposers 9 so that only a single level of metal is required in the decals itself, thus there are no X-Y crossovers on the decals so that when a signal leaves a semiconductor segment 32 the required crossings are made before reaching the decal so that on the receiving interposer, the signals are already aligned to their destinations. This minimizes the total number of feed throughs required in the interposer itself and also substantially reduces the wiring in the underlying multilayered ceramic module because this wiring arrangement constitutes an additional high density X-Y pair of transmission lines. Decals 29 are similar to decals 31, except that the signal instead of traveling from interposer to interposer, travel from an interposer to the underlying substrate 8, providing a peripheral off substrate path. Thus, the decals essentially provide communication between the interposers, and also provide an extra level of high density wiring which eliminates the need for another X-Y wiring pair in the multilayered ceramic 8 or interposer 9.

The signal feed-throughs 24 provide paths for signals between the interposers 9 and also between the interposers 9 and underlying module 8. These paths would be used typically where long wiring runs were required, so that the higher conductivity wiring of the underlying module may be used. Because of the unique thin film structure of the package, the noise voltage level in the package is very low in comparison to the lowest logic threshold voltage in the package, and a high density of integrated circuits on semiconductor segments 32 may function at high speeds substantially without the need for the amplification of drivers within each interposer 9, or with a minimum number of drivers and receivers, i.e. much less than that required by Rent's Rule. The following operation section will explain this phenomena in greater detail.

OPERATION

As stated in the structure section above, this invention provides high density, high speed packaging structure that emulates wafer scale integration. The operation and success in emulating wafer scale integration by making most signal transfers without drivers and receivers results from the following inherent characteristics of the invention during operation.

This package achieves the speeds associated with very large wafer scale integration type chips and wafers insofar as there are no staging or switching delays associated with going through drivers and receivers. Moreover, wafer scale integration densities are possible without having to adequately yield the wafer scale integration structure, which is not possible in the present state of the art; and redundancy schemes are not required.

The high density is achieved on each interposer 9 because semiconductor segments 32 are placed in close proximity to each other (i.e. brickwalled) while highly dense thin film interconnections between semiconductor segments are made. High input/output densities from each semiconductor segment 32 is capable because small solder balls 34 can be used to make interconnections between the semiconductor segments and the interposers 9. The thermal coefficient of expansion match between the preferred silicon base 10 and the semiconductor segments 32 permits very high solder ball densities, even if the solder balls 34 are in the 1–3 mil diameter range as required by the preferred embodiment.

In addition to density advantages the large amount of input/output on each semiconductor segment 32 also contributes to enhance machine speed. The increased input/output due to the increased number of solder balls 34 increases the useability of internal circuits on the semiconductor segments, which in turn reduces the number of semiconductor segments required to do a given function. Since the reduced number of semiconductor segments 32 is required to do the same function as a greater number of standard chips made by the same basic technology as the semiconductor segments, more interaction between integrated circuits can take place on each semiconductor segment 32, and correspondingly, on each interposer 9.

The small solder balls 34 also enhance speed because they reduce the lump capacitance facing the interconnections between the top wiring layer 25 and the circuits on the semiconductor segments 32. In addition to enhancing speed, the reduced lump capacitance is a vital factor in allowing signal transmission without drivers and receivers because no large capacitance is introduced into the transmission lines, causing electrical discontinuities and reflections that drivers would otherwise have to overcome.

Machine speed (through reduced delay times, etc.) is improved through substantially driverless/receiverless on-interposer communication. This is possible because of the extremely quiet electrical environment on the interposers. The coupled noise, delta I noise, DC drop and noise due to reflections are diminished primarily because of: (1) Coplanar wiring levels 25 and 23, where there are alternating power and signal lines, 47, 45, 46, 48 and 47a, 45a, 46a, 48a, respectively, such that the power lines shield the signal lines from each other, reducing noise; and (2) The power distribution throughout the interposers 9 is accomplished by distributing various power and ground connections from the bottom of the interposer to layers of metallization 11, 13 on the interposer which are mutually capacitive; and through feed-throughs 16, which provide additional capacitance to a distribution framework which is comprised of a square hatch three-dimensional highly coupled low inductance power distribution plane made of interconnected power lines 45, 46, 48 from wiring levels 23 and 25. The low inductance power distribution is a significant factor in minimizing total noise in the package.

All of the above factors combine to provide power distribution which provides an extremely low noise environment for the integrated circuit signals. This low noise environment results in a noise level substantially less than the lowest logic threshold voltage in the package. The aforementioned structure and operation make it possible to transmit the overwhelming majority of on-interposer signals without drivers and receivers. This, in turn, is the basis for each interposer emulating a wafer scale integration chip or wafer.

A significant portion of off-interposer signals are transmitted through the decals 29, 31. In electrical packaging, reflections of signals occur when there are impedance discontinuities. When there are no impedance discontinuities, reflections are minimized and if a ground plane is incorporated into the decals, the entire package of interposers and decals is made electrically continuous. The decals electrically impedance match the interposers, hence they are electrically continuous with the interposers and present a medium from which little reflections or noise occur.

The performance of a processor 1 or portion thereof, comprising a plurality of interposers 9 on a module 8 provides sufficient speed and density to package the computing power of a high end main frame central processing unit (i.e., having cycle times in the 18-20 ns range) on a module approximately 5 inches square. This is approximately an area equal to 1/30 of a central processing unit made of state of the art technology thermal conduction modules wherein standard integrated circuit chips are mounted on ceramic modules plugged into boards. The elimination of levels of packaging and numerous board and cable delays considerably reduces the cycle time of a processor 1 made in accordance with the teachings of this invention.

While the present invention has been disclosed in connection with the preferred embodiment thereof, it should be understood that there may be other embodiments which fall within the spirit and scope of the invention as defined by the following claims.

What is claimed is:

1. A high performance integrated circuit packaging structure comprising:
    a substrate;
    alternating insulation and conductive layers on said substrate;
    a plurality of internal circuits integrated into discrete semiconductor segments;
    said discrete semiconductor segments mounted on an uppermost conductive layer;
    said semiconductor segments placed in close enough proximity to each other so that performance is equal to that of a monolithic integrated circuit structure;
    an array of feedthroughs in said substrate, a plurality of said feedthroughs located beneath said semiconductor segments;
    wiring means incorporated into at least two of said conductive layers for providing connections for said internal circuits;
    said wiring means being adapted for maintaining a noise voltage level in said integrated circuit structure which is substantially less than the lowest logic threshold voltage in said integrated circuit structure so that said plurality of internal circuit groups collectively have a number of drivers and receivers which is less than the number provided for by Rent's Rule.

2. The packaging structure of claim 1 wherein said wiring means are comprised of at least two layers, each layer having substantially coplanar power and signal lines, wherein substantially all of said substantially coplanar signal lines are separated from each other by at least one substantially coplanar power line, and
    said power lines of each layer are electrically interconnected so that the voltage levels of any two interconnected power lines are the same, whereby at least one power plane at a particular voltage level exists in three dimensions.

3. The packaging structure of claim 1 wherein said substrate is made of a semiconductor material.

4. The integrated circuit packaging structure of claim 1 wherein said wiring means comprise a plurality of signal wiring lines and power distribution structures.

5. The integrated circuit packaging structure of claim 1 wherein said plurality of internal circuit groups collectively has a number of drivers and receivers which is less than the number provided for by Rent's Rule, and greater than or equal to the following expression:

$$S \div \frac{\sum_{1}^{n}(C_m^R)}{\left(\sum_{1}^{n} C_m\right)^R}$$

wherein
    n is equal to said plurality of internal circuit groups;
    S = the number of drivers and receivers required according to Rent's Rule;
    $C_m$ is equal to the number of logic circuits in each internal circuit group, and
    R = Rent's exponent.

6. The integrated circuit packaging structure of claim 2 wherein said plurality of internal circuit groups collectively has a number of drivers and receivers which is less than the number provided for by Rent's Rule, and greater than or equal to the following expression:

$$S \div \frac{\sum_{1}^{n}(C_m^R)}{\left(\sum_{1}^{n} C_m\right)^R}$$

wherein
    n is equal to said plurality of internal circuit groups;
    S = the number of drivers and receivers required according to Rent's Rule;
    $C_m$ is equal to the number of logic circuits in each internal circuit group, and
    R = Rent's exponent.

7. The integrated circuit packaging structure of claim 1 wherein said wiring means provide a ratio of lowest signal threshold voltage to coupled noise plus delta-I noise of greater than or equal to approximately 10 to 1.

8. The integrated circuit packaging structure of claim 2 wherein said wiring means provide a ratio of lowest signal threshold voltage to coupled noise plus delta-I noise of greater than or equal to approximately 10 to 1.

9. The packaging structure of claim 3 wherein said substrate is made of silicon.

10. The packaging structure of claim 1 wherein said semiconductor segments are mounted to said uppermost conductive layer by solder balls between approximately 1 and 3 mils in diameter.

11. The packaging structure of claim 9 wherein there are signal feedthroughs through said silicon, said signal feedthroughs comprising;
   a central conductor, a low expansion dielectric substantially surrounding said conductor, and an insulator surrounding said low expansion dielectric.

12. The packaging structure of claim 11 wherein said low expansion dielectric is polyimide.

13. The packaging structure of claim 1 wherein said array of feedthroughs is comprised of substantially all power feedthroughs.

14. The packaging structure of claim 1 wherein said array of feedthroughs is comprised of both signal and power feedthroughs.

15. The packaging structure of claim 2 wherein said signal wiring lines are between approximately 3 and 10 microns wide, and between approximately 3 and 10 microns tall.

16. The packaging structure of claim 15 wherein said signal and power lines are spaced between approximately 5 and 10 microns apart.

17. The integrated circuit packaging structure of claim 1 further comprising at least one other of said integrating circuit packaging structures, said structures being connected to each other and to a mother substrate.

18. The packaging structure of claim 17 wherein said mother substrate is a multi-layered ceramic substrate.

19. The packaging structure of claim 17 wherein said connections between said integrated circuit packaging structures are made by decals.

20. The packaging structure of claim 19 wherein said decals comprise a flexible carrier layer having at least one signal wiring layer and one ground layer therein.

21. The packaging structure of claim 3 wherein at least one of said drivers is present in said semiconductor substrate.

22. The packaging structure of claim 17 wherein said substrate is made of a semiconductor material.

23. The packaging structure of claim 22 wherein at least one of said drivers is present in said semiconductor substrate.

24. The packaging structure of claim 3 wherein there are substantially no drivers in said discrete semiconductor segments, and a plurality of drivers in said semiconductor substrate.

25. The packaging structure of claim 22 wherein there are substantially no drivers in said discrete semiconductor segments, and a plurality of drivers in said semiconductor substrate.

* * * * *

UNITED STATES PATENT AND TRADEMARK OFFICE
CERTIFICATE OF CORRECTION

PATENT NO. : 4,811,082
DATED : March 7, 1989
INVENTOR(S) : S. L. Jacobs, et al.

It is certified that error appears in the above-identified patent and that said Letters Patent is hereby corrected as shown below:

| | |
|---|---|
| Col. 5, line 36 | after "an", please insert --alternate--. |
| Col. 7, line 21 | in the equation in the denominator, delete "Cm" and insert therefor --$C_m$--. |
| Col. 12 line 5 | delete "the". |
| Col. 12, line 33 | after "shown" please insert --in Figure 3, which is similar to Figure 2 and the common reference numbers have been defined in the context of Figure 2 and appear with a prime--. |
| Claim 5, Col. 16 line 36 | in the numerator and in the denominator of the equation, delete "Cm" and substitute therefor --$C_m$--. |
| Claim 5, Col. 16 line 45 | delete "Cm" and substitute therefor --$C_m$--. |
| Claim 6, Col. 16 line 56 | in the numerator and in the denominator of the equation, delete "Cm" and substitute therefor --$C_m$--. |

UNITED STATES PATENT AND TRADEMARK OFFICE
CERTIFICATE OF CORRECTION

PATENT NO. : 4,811,082

DATED : March 7, 1989

INVENTOR(S) : S. L. Jacobs, et al.

It is certified that error appears in the above-identified patent and that said Letters Patent is hereby corrected as shown below:

Claim 6, Col. 16 line 64      delete "Cm" and substitute therefor $--C_m--$.

Signed and Sealed this

Twenty-third Day of July, 1991

Attest:

HARRY F. MANBECK, JR.

*Attesting Officer*      *Commissioner of Patents and Trademarks*